United States Patent
Jones

[11] Patent Number: 6,024,107
[45] Date of Patent: *Feb. 15, 2000

[54] APPARATUS FOR CLEANING ROBOT END EFFECTOR

[75] Inventor: Oliver David Jones, Watsonville, Calif.

[73] Assignee: Lam Research Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/757,698

[22] Filed: Dec. 3, 1996

Related U.S. Application Data

[62] Division of application No. 08/680,739, Jul. 15, 1996, Pat. No. 5,778,554.

[51] Int. Cl.⁷ .................................................. B08B 3/02
[52] U.S. Cl. ...................... 134/104.1; 134/198; 134/902; 134/199
[58] Field of Search .................. 134/104.1, 902, 134/198, 95.2, 102.3, 199, 15; 239/690, 580; 901/43; 422/292

[56] References Cited

U.S. PATENT DOCUMENTS

| | | | |
|---|---|---|---|
| 3,918,987 | 11/1975 | Kopfer | 134/199 |
| 4,313,266 | 2/1982 | Tam | 34/8 |
| 4,552,163 | 11/1985 | Biancalana et al. | |
| 4,651,440 | 3/1987 | Karl | 34/58 |
| 4,694,527 | 9/1987 | Yoshizawa | 134/902 |
| 4,830,882 | 5/1989 | Ichinose | |
| 4,871,417 | 10/1989 | Nishizawa et al. | 156/640 |
| 4,903,717 | 2/1990 | Sumnitsch | 134/99 |
| 4,924,890 | 5/1990 | Giles et al. | 134/61 |
| 4,936,328 | 6/1990 | Yatabe | 134/902 |
| 4,938,933 | 7/1990 | Perrot | |
| 4,974,619 | 12/1990 | Yu | 134/902 |
| 4,977,911 | 12/1990 | Vetter et al. | 134/34 |
| 4,989,345 | 2/1991 | Gill, Jr. | 34/58 |
| 5,050,316 | 9/1991 | Aigo | 34/58 |
| 5,127,363 | 7/1992 | Nakamura et al. | 134/104.1 |
| 5,177,514 | 1/1993 | Ushijima et al. | 134/902 |
| 5,226,437 | 7/1993 | Kamikawa et al. | 134/401.1 |
| 5,253,663 | 10/1993 | Tanaka et al. | 134/902 |
| 5,261,431 | 11/1993 | Ueno et al. | 134/104.1 |
| 5,265,632 | 11/1993 | Nishi | 134/902 |
| 5,379,784 | 1/1995 | Nishi et al. | 134/104.1 |
| 5,468,302 | 11/1995 | Thietje | 134/1 |
| 5,469,634 | 11/1995 | Mezaki | 34/58 |
| 5,520,744 | 5/1996 | Fujikawa et al. | 134/11 |
| 5,601,100 | 2/1997 | Kawakami et al. | 134/199 |
| 5,635,425 | 6/1997 | Chen | 438/631 |
| 5,693,150 | 12/1997 | Powell | |

FOREIGN PATENT DOCUMENTS

| | | |
|---|---|---|
| 41 29 778 A1 | 7/1992 | Germany . |
| 2-134820 | 5/1990 | Japan . |
| 87 07002 | 11/1987 | WIPO . |
| 95 11518 | 4/1995 | WIPO . |

*Primary Examiner*—Frankie L Stinson
*Attorney, Agent, or Firm*—Martine Penilla & Kim, LLP

[57] ABSTRACT

In a spin dryer for semiconductor wafers, the wafer is held beneath a platen with its active side (i.e., the side containing the components or circuitry) facing upward. One or more nozzles spray rinse water on the top surface of the wafer and the wafer is rotated to remove the excess rinse water, thereby drying the wafer. A splash guard adjacent the edge of the wafer insures that the excess rinse water thrown off by the spinning wafer is deflected downward where it cannot again come into contact with the active side of the wafer. The platen is rotated dry at the same time, with no rinse water being splashed back onto the active side of the wafer. The spin dryer also includes a separate section which cleans and dries the end-effector of the robot which inserts the wafer into the spin dryer while the wafer is being dried.

11 Claims, 10 Drawing Sheets

APPARATUS FOR CLEANING ROBOT END EFFECTOR

This application is a division of application Ser. No. 08/680,739, filed Jul. 15, 1996 now U.S. Pat. No. 5,778,554.

FIELD OF THE INVENTION

This invention relates to a device for rinsing and drying flat substrates such as semiconductor wafers.

BACKGROUND OF THE INVENTION

In recent years it has become common in the semiconductor industry to polish the wafers after successive layers of conductive traces or other structures are formed on their surfaces. This produces very smooth surfaces for repeated photolithographic processes and significantly improves the yield. The polishing process, typically chemical-mechanical polishing (CMP), leaves grit and other debris on the surface of the wafer which must be removed before fabrication process can continue. This has led to the development of wafer cleaning devices, such as the device described in co-pending application Ser. No. 08/683,654, which is incorporated herein by reference in its entirety. Following cleaning, the wafers must be thoroughly dried before they can be returned to the fabrication line.

Figure 1:
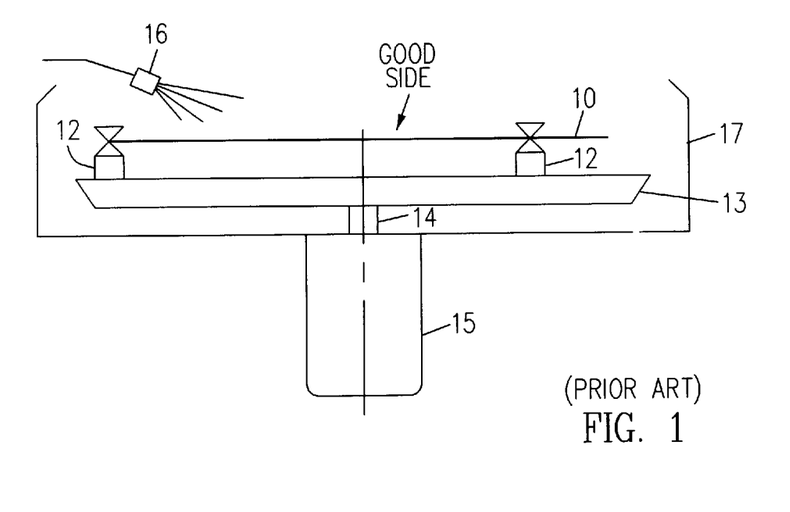
FIG. 1 illustrates a prior art wafer spin dryer in which the wafer is positioned above the platen with its good side facing up.
Figure 2:
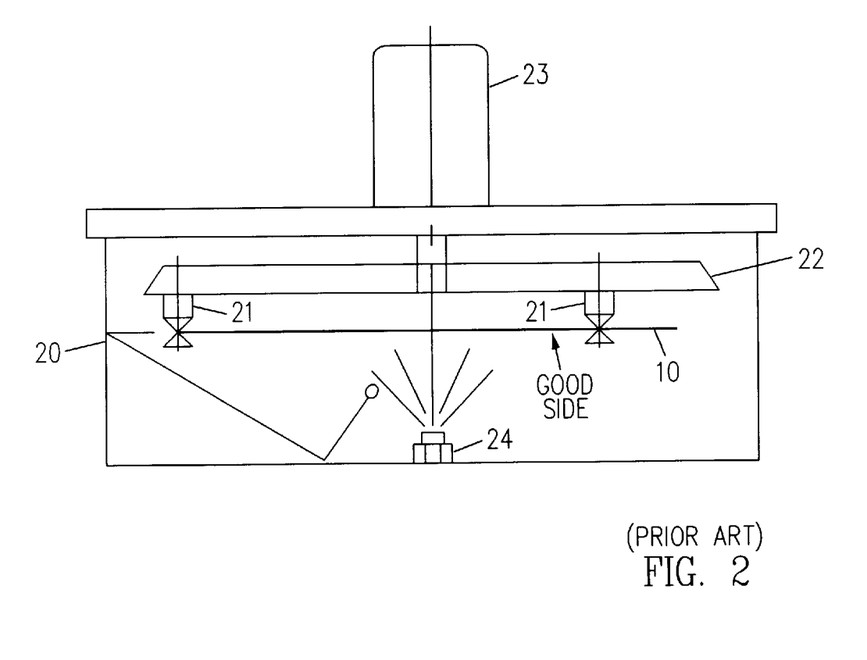
FIG. 2 illustrates a prior art wafer spin dryer in which the wafer is positioned below the platen with its good side facing down.

Wafer spin dryers use a combination of centrifugal force and air flow to remove all moisture from the surface of the wafer. Two known types of spin dryers are illustrated in FIGS. 1 and 2. In the version shown in FIG. 1, a wafer 10 is held by fingers 12 above a platen 13. Platen 13 is rotated on a shaft 14 by a spin motor 15. Rinse water is applied from above by one or more nozzles 16 to the "good" (active) side of wafer 10. A problem with this type of dryer is that the drying chamber 17 is open to the atmosphere, which while normally quite clean still contains particulate matter. Particles which fall onto the wafer during and immediately following the drying operation will remain when the next process step begins.

In the prior art dryer shown in FIG. 2, the drying chamber 20 is not open to the atmosphere from above, and the wafer 10 is held by fingers 21 below the platen 22. The platen is spun by a motor 23 which is mounted above the platen. The good side of the wafer faces downward, and one or more nozzles 24 rinse wafer 10 from below. A problem with this type of dryer is that water droplets which are thrown from the spinning wafer can strike the surface of the drying chamber and splash against the good side of the wafer.

Thus there is a need for a wafer dryer which avoids the above problems and reliably yields a clean, dry wafer suitable for further processing.

SUMMARY OF THE INVENTION

The wafer spin dryer of this invention includes a platen and a plurality of holding members or fingers which extend downward from the platen. The wafer is held with its good or active side facing upward. One or more nozzles are positioned so as to direct a rinse liquid (typically water) against the good side of the wafer. The rinsing liquid is applied to the good side of the wafer, and the wafer is rotated to create a centrifugal force which removes the liquid from the good side of the wafer. A surface laterally adjacent the edges of the spinning wafer is contoured and angled such that the liquid which flies from the wafer is directed downward to a portion of the drying chamber below the wafer. As a result, the used rinse liquid cannot come into contact with the good side of the wafer.

The wafer is preferably placed in the spin dryer by a robot. In the preferred embodiment, the wafer is held in the spin dryer by three fingers which extend downward from the platen and which are spaced at equal (120°) angles around the axis of rotation. The fingers contain notches or other concave surfaces which grip the edge of the wafer. One of the fingers is movable to allow the robot to place the wafer in a position where it can be held by the three fingers. The wafer is positioned slightly eccentric to the axis of rotation such that it is forced against the two fixed fingers as it is rotated. The rotating mass (wafer and platen) is balanced as a whole so that undue vibrations do not occur as the wafer is rotated.

In many situations, the same robot arm places the wafer into the cleaner, transfers the wafer from the cleaner to the dryer, and transfers the wafer from the dryer to the finished wafer cassette. The end-effector of the robot arm can thus become contaminated with grit and chemicals. As another aspect of this invention, the wafer dryer contains a separate chamber which is used to clean and dry the end-effector while the wafer is being dried. Thus, when the wafer is withdrawn from the spin dryer, it does not become re-contaminated with grit and/or chemicals from the end-effector.

In the preferred embodiment the end-effector cleaning chamber contains one or more nozzles which spray a rinse liquid onto the end-effector and one or more nozzles which direct a flow of nitrogen against the end-effector and sweep the rinse liquid from the end-effector as it is being withdrawn from the end-effector cleaning chamber.

DESCRIPTION OF THE INVENTION

Figure 3:
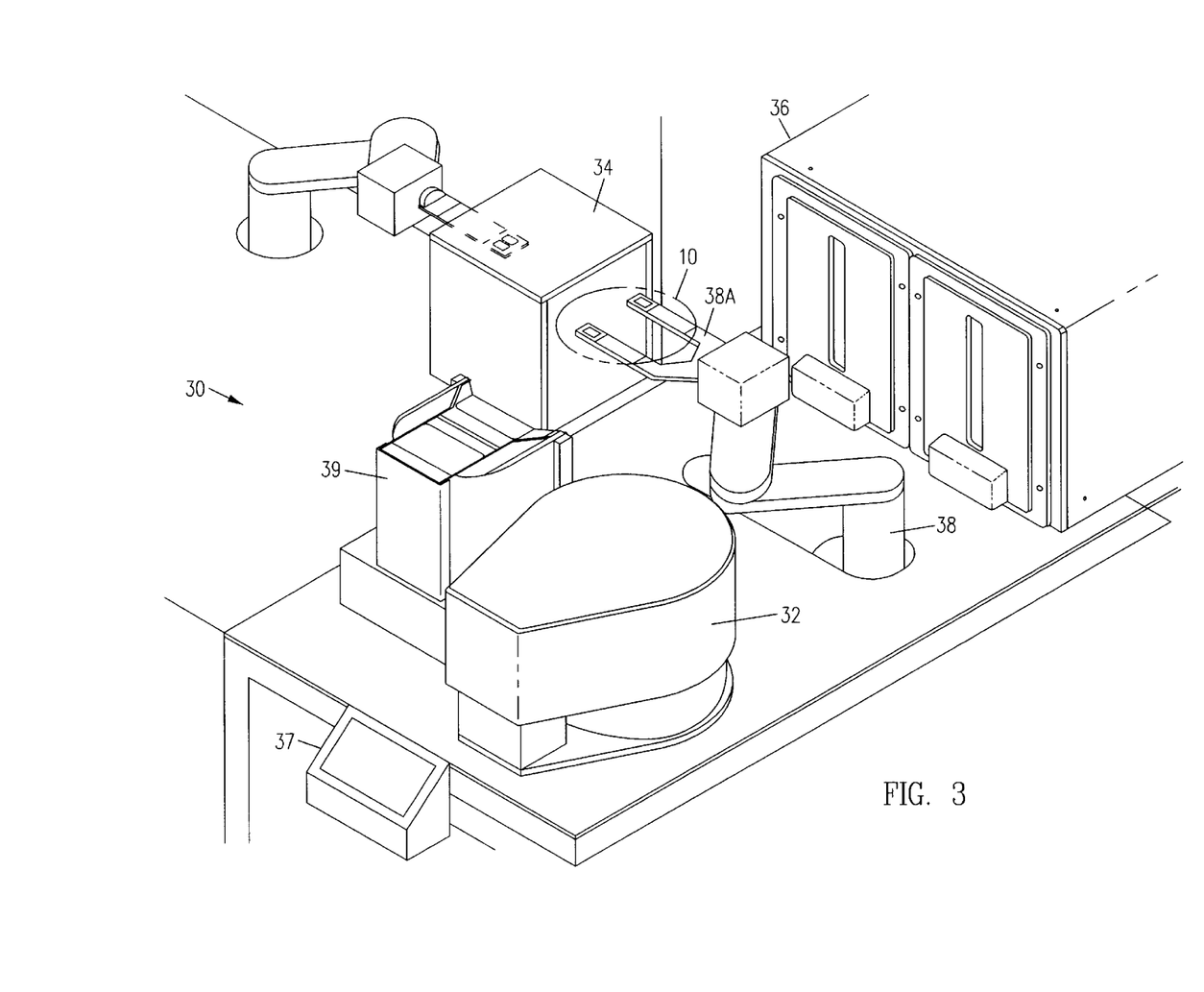
FIG. 3 is a general view of a wafer cleaning/drying system, including the wafer spin dryer of this invention and a robot for transferring the wafers between units.

A wafer cleaning/drying system 30 is shown in the general perspective view of FIG. 3. System 30 includes a wafer spin dryer 32 in accordance with this invention. Also shown are a buffer unit 34, a wafer cleaning unit 36, a robot 38, and a finished wafer cassette 39. Robot 38 grips the wafers with a vacuum actuated end-effector 38A of a kind widely used in the semiconductor processing industry. In normal operation, the wafers are placed into buffer unit 34 from a CMP unit. Robot 38 takes the wafers from buffer unit 34 and inserts them into the cleaning unit 36, where they are scrubbed and rinsed. Wafer cleaning unit 36 is preferably of the kind described in the above-referenced application Ser. No. 08/683,654. After the wafers have been cleaned, robot 38 removes them from the cleaning unit 36 and inserts them into the wafer spin dryer 32. After further rinsing and drying, the wafers are placed into the finished wafer cassette 39.

The operation of the various units in system 30 is controlled by a programmable logic controller (PLC) (not shown) which may, for example, be a Model 2600, manufactured by Control Technology Corp. of Hopkinton, Mass. The PLC is controlled from a control panel 37.

Figure 4:
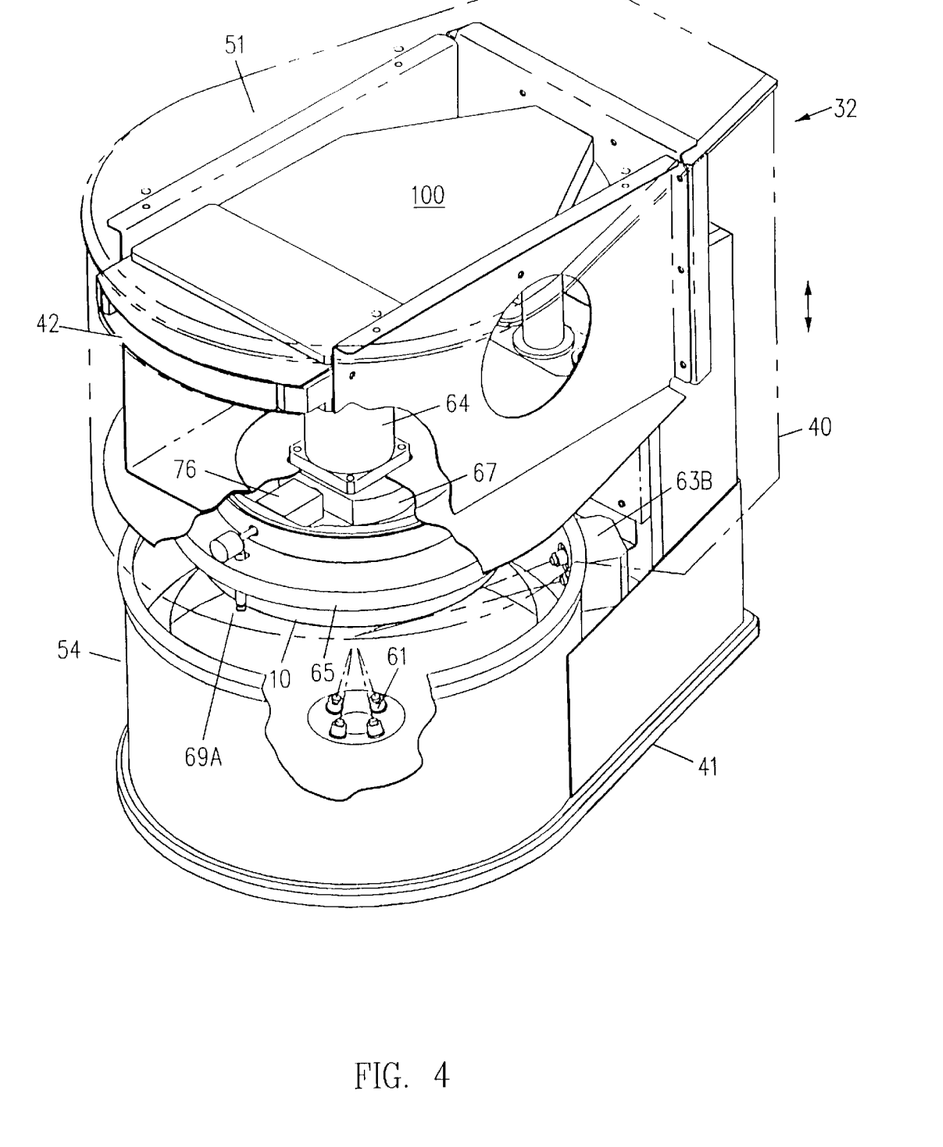
FIG. 4 is a broken away perspective view of a wafer spin dryer of this invention.

FIG. 4 shows a broken away perspective view of wafer spin dryer 32 taken from the other side as compared with the view of FIG. 3. Wafer spin dryer 32 includes a hood unit 40, which is movable vertically to allow wafers to be inserted into the spin dryer, and a base unit 41. Hood unit 40 includes a slot 42 at the entrance of a section (described below) which is used to clean and dry the end-effector 38A of robot 38 while a wafer is being dried in spin dryer 32.

Figure 5A:
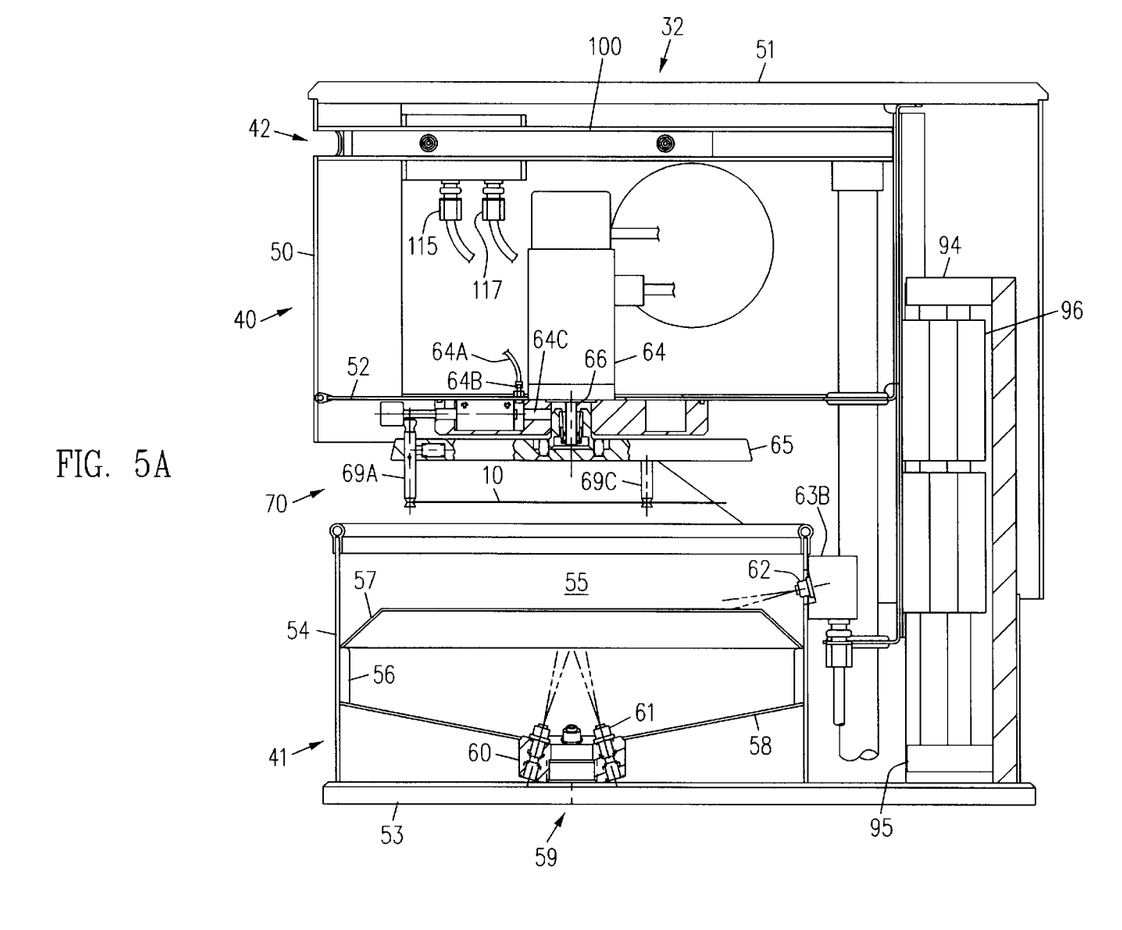
FIGS. 5A and 5B are broken away side and end views, respectively, of the wafer spin dryer in an open position allowing the introduction of a wafer.
Figure 5B:
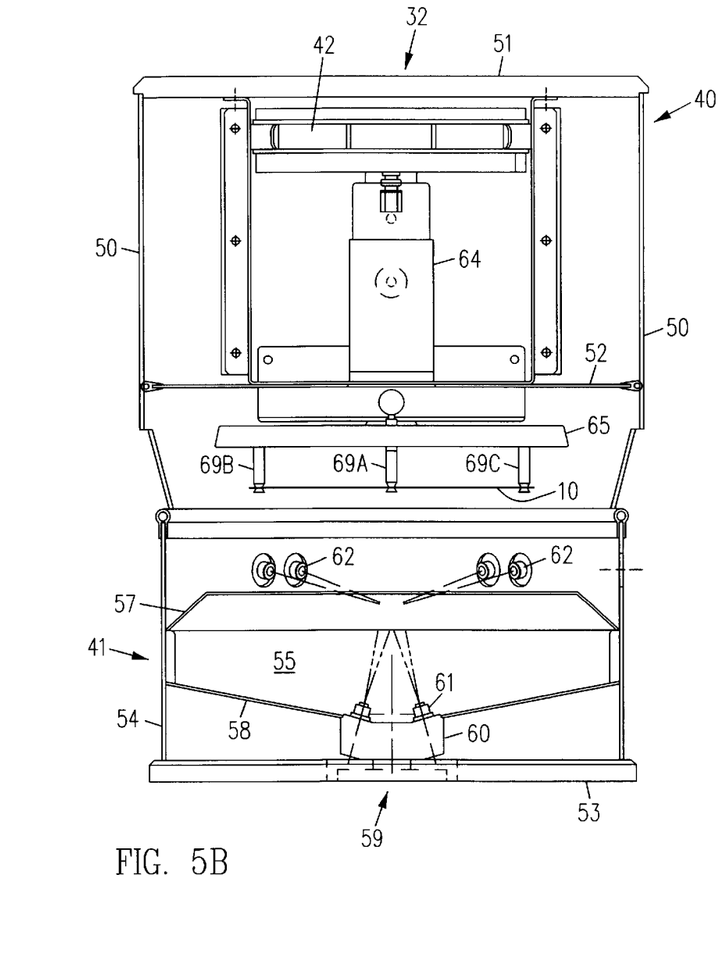

FIGS. 5A and 5B are broken away side and end views, respectively, of wafer spin dryer 32 in an open position, with hood unit 40 in a raised position, allowing a wafer to be inserted into wafer spin dryer 32. Hood unit 40 preferably includes an external housing 50 of plastic, a top plate 51 also formed of plastic, and a horizontal mounting plate 52 formed of sheet metal. The housing of hood unit 40 is assembled in a conventional manner with plastic welding.

Base unit 41 includes a base plate 53 and a cylindrical side housing 54 for a drying chamber 55. A bracket 56 is attached to the inside surface of side housing 54. Extending upward from bracket 56 is a conical splash guard 57, and extending downward from bracket 56 is a conical floor 58 of drying chamber 55. Floor 58 slopes down to a drain 59 which is located at the lowest point in drying chamber 55 to remove any rinse water which accumulates in chamber 55 during the drying process. Drain 59 extends through a manifold block 60 which is mounted on base plate 53. Manifold block 60 is used to supply water to a set of nozzles 61 which are used to direct rinse water upward at the back side of the wafer. A lower edge of floor 58 is welded to manifold block 60.

A second set of nozzles 62 are mounted in a pair of manifold blocks 63A and 63B which are attached to side housing 54 as shown in FIG. 5A. Nozzles 62 are positioned such that they direct a stream or spray of rinse water against the good side of a wafer when spin dryer 32 is in the closed position, with hood unit 40 lowered (see FIGS. 6A and 6B). As is evident from FIG. 5B, each of manifold blocks 63A and 63B supplies two nozzles 62, and manifold blocks 63A and 63B are positioned on opposite sides of the centerline of drying chamber 55. Nozzles 62 are oriented so as to direct a stream or spray of rinse water downward at an angle against the good side of a wafer.

Manifold blocks 63A and 63B are preferably made of plastic and manifold block 60 is preferably made of stainless steel. Manifold blocks 60, 63A and 63B have channels and cavities formed therein in a customary manner to supply the rinse water to the respective nozzles. Rinse water is supplied to manifold blocks 60, 63A and 63B via fittings and tubes which are generally not shown in FIGS. 5A, 5B, 6A and 6B. The flow of rinse water into the manifold blocks and nozzles is controlled by valves which are remote from the manifold blocks and which are in turn controlled by the PLC in wafer spin dryer 32. The detailed structure of these elements has been omitted from the drawings for the sake of clarity but will be readily understood by persons skilled in the art.

Referring again to FIGS. 5A and 5B, a spin motor 64 is mounted on the upper side of horizontal mounting plate 52. A platen 65 is positioned below spin motor 64 and is driven by a drive shaft 66. The details of this structure are shown in the cross-sectional view of FIG. 7. Motor 64 is mounted on a mounting block 67, which is attached to the bottom side of horizontal mounting plate 52 with screws. Drive shaft 66 is connected to a hub 68 by means of a collet 69. The top side of platen 65 contains a recess into which hub 68 fits, and platen 65 is attached with screws to hub 68. Platen 65 is a circular plate of polypropylene which in the preferred embodiment is about 0.5 inches thick. To remove any airborne particles which might be generated by the bearings of motor 64, a vacuum is applied through a tube 64A and a fitting 64B to a cavity 64C which is formed in mounting block 67 (see FIG. 5A). Cavity 64C communicates with the space surrounding hub 68, and thus any particles generated by the motor bearings are drawn through tube 64A.

Figure 7:
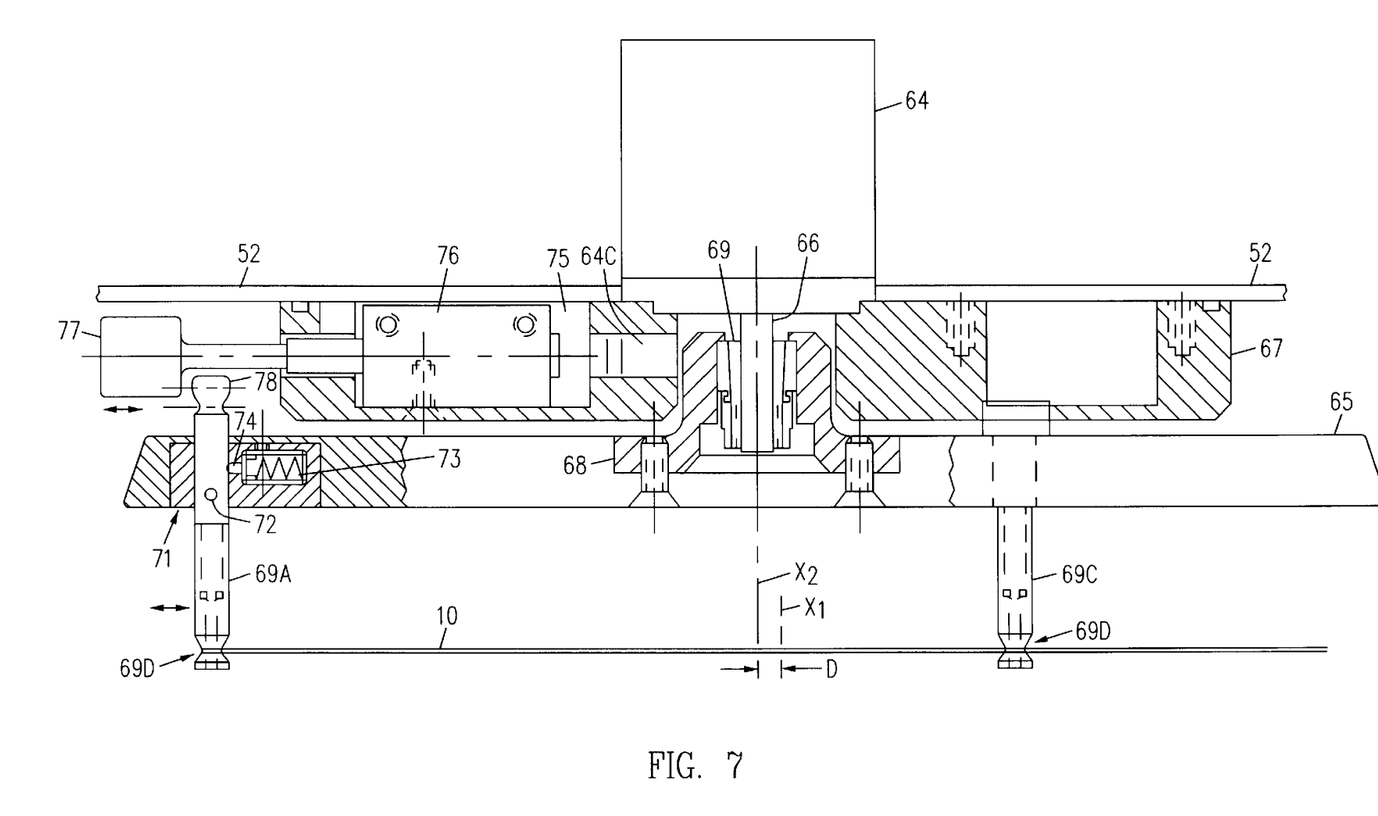
FIG. 7 is a cross-sectional view of the platen and associated mechanisms.

Referring again to FIG. 5B, fingers 69A, 69B and 69C extend downward from platen 65 for gripping wafer 10. Finger 69A is located near the entrance 70 through which wafers are inserted into spin dryer 32, and fingers 69B and 69C are located away from the entrance. As is evident from FIG. 7, finger 69A can be pivoted so as to permit wafer 10 to be positioned between fingers 69A, 69B and 69C. FIG. 7 also shows notches 69D that are formed in fingers 69A, 69B and 69C. When finger 69A is in its normal, unpivoted position the edges of wafer 10 fit within notches 69D, and wafer 10 is held in a fixed position below platen 65. As described further below, the good or active side of wafer 10 (i.e., the side on which the electronic circuitry and components are formed) faces upward in the direction of platen 65 during the drying process. Fingers 69A, 69B and 69C are positioned at equal angular intervals about the central axis of wafer 10 when wafer 10 is held in position for drying.

Figure 8:
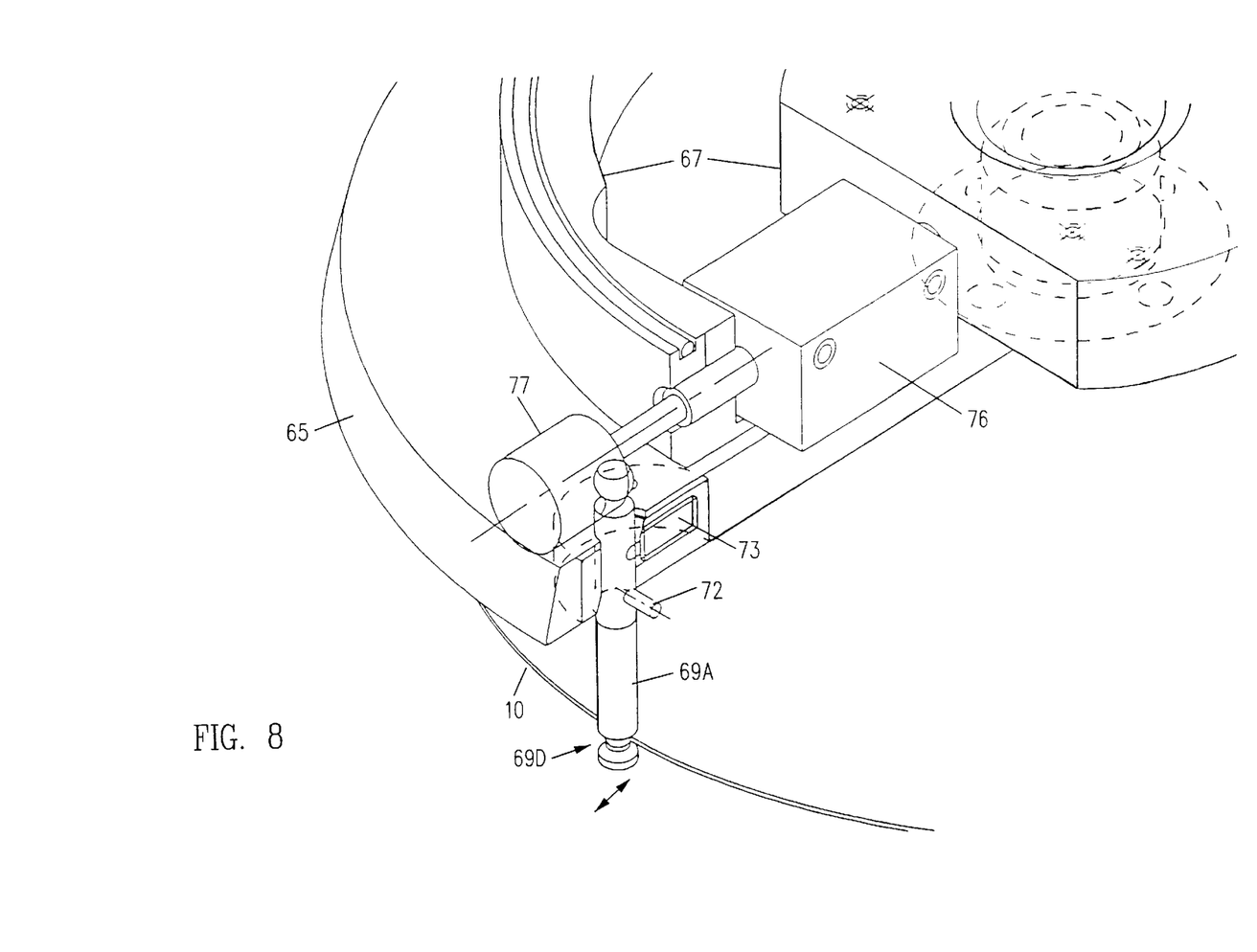
FIG. 8 is a broken away view of the mechanism for pivoting one of the fingers used to grip the wafer.

FIGS. 7 and 8 illustrate the mechanism used to pivot finger 69A. Finger 69A is mounted in a slot 71 in platen 65, which permits finger 69A to pivot about a horizontal axis on a pin 72 between a vertical position, where a wafer is held in place, and a tilted position, which allows a wafer to be inserted between fingers 69A, 69B and 69C.

A spring plunger 73 is mounted in a cavity in platen 65 adjacent finger 69A. Spring plunger 73 contains an actuator 74 which presses laterally against finger 69A at a location above pin 72 and thereby urges finger 69A into its vertical position.

An annular cavity 75 is formed in mounting block 67, and a pneumatic cylinder 76 is mounted in the cavity. Pneumatic cylinder 76 has a club-shaped actuator 77 which extends radially outward. When pneumatic cylinder 76 is in its normal position, shown in FIG. 7, there is a small clearance between actuator 77 and a top end 78 of finger 69A. When pneumatic cylinder 76 is actuated, actuator 77 is pulled to the right (in FIG. 7) and causes finger 69A to pivot about shaft 72 to its tilted position. Spin motor 64 is preferably a servo motor and thus can be controlled to stop at a selected angular position with finger 69A located radially inward from club-shaped actuator 77.

Figure 9:
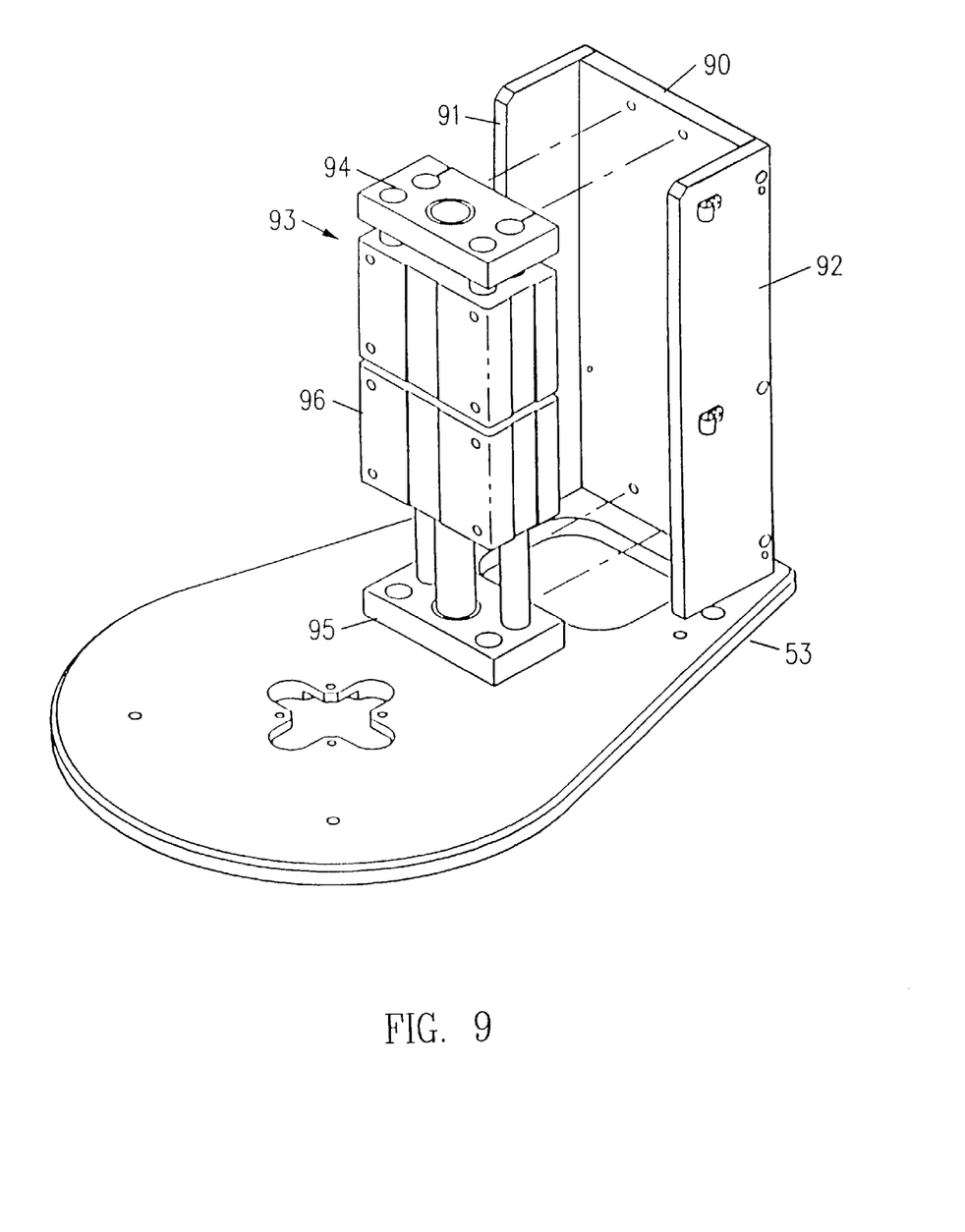
FIG. 9 is an exploded view of the mechanism for lifting and lowering the hood unit of the spin dryer.

The details of the mechanism used to lift and lower hood unit 40 is shown in FIG. 9, although many alternative techniques for accomplishing this will be apparent to those skilled in the art. A rear support plate 90 and side support plates 91 and 92 are mounted on base plate 53. A pneumatic lifting mechanism 93 is mounted inside the support plates 90, 91 and 92, with a top member 94 and a bottom member 95 being bolted to rear support plate 90. Air pressure tubes are connected to pneumatic lifting mechanism 93 and are controlled to cause a lifting member 96 to rise and fall. Lifting member 96 is bolted to a vertical interior wall within hood unit 40, thereby enabling hood unit 40 to rise and fall with lifting member 96. Lifting mechanism 93 is advantageously the rodless cylinder manufactured by Tol-o-matic of Minneapolis, Minn.

The operation of spin dryer 32 will now be described. Initially, lifting mechanism 93 causes hood unit 40 to move to its raised position, thereby opening entrance 70 to the interior of drying chamber 55. Robot 38 removes wafer 10 from cleaning unit 36, using its vacuum actuated end-effector 38A, and inserts wafer 10 into drying chamber 55 with the good or active side of wafer 10 facing upward. Pneumatic cylinder 76 is actuated. Since platen 65 is in its "home" index position, with club-shaped actuator 77 adjacent upper end 78 of finger 69A, this causes finger 69A to pivot to its tilted position. Robot 38 lifts wafer 10 to a position between fingers 69A, 69B and 69C, at the level of notches 69D, and then adjusts the lateral position of wafer 10 until the edge of wafer 10 comes into contact with the notches 69D of fingers 69B and 69C. Pneumatic cylinder 76 is then actuated so as to allow spring plunger 73 to force finger 69A to its vertical position, firmly clamping wafer 10 in notches 69D of fingers 69A, 69B and 69C. The sides of notches 69D are sloped at an angle (e.g., 45°) which allows for a small error in the vertical positioning of wafer 10 by robot 38 while insuring that wafer 10 is properly seated in notches 69D.

From FIG. 7 it will be noted that the center $X_1$ of wafer 10 is slightly displaced in the direction of fixed fingers 69B and 69C from the axis of rotation $X_2$ of platen 65 and wafer 10. For an eight-inch wafer, this displacement D is approximately 1/8". This insures that as wafer 10 rotates it presses against the fixed fingers 69B and 69C rather than the movable finger 69A. If wafer 10 were to press against movable finger 69A, it might overcome the force of spring plunger 73 and cause finger 69 to pivot, releasing wafer 10 from the grip of fingers 69A, 69B and 69C. Platen 65 is appropriately counter-balanced to compensate for the offset position of wafer 10 and avoid vibrations from occurring when wafer 10 is being rotated.

With wafer 10 gripped by fingers 69A, 69B and 69C, the end-effector 38A is withdrawn through entrance 70. After the wafer spin dryer 32 has been closed to begin the drying process, end-effector 38A is inserted through slot 42 into the end-effector cleaning section (described below).

Figure 6A:
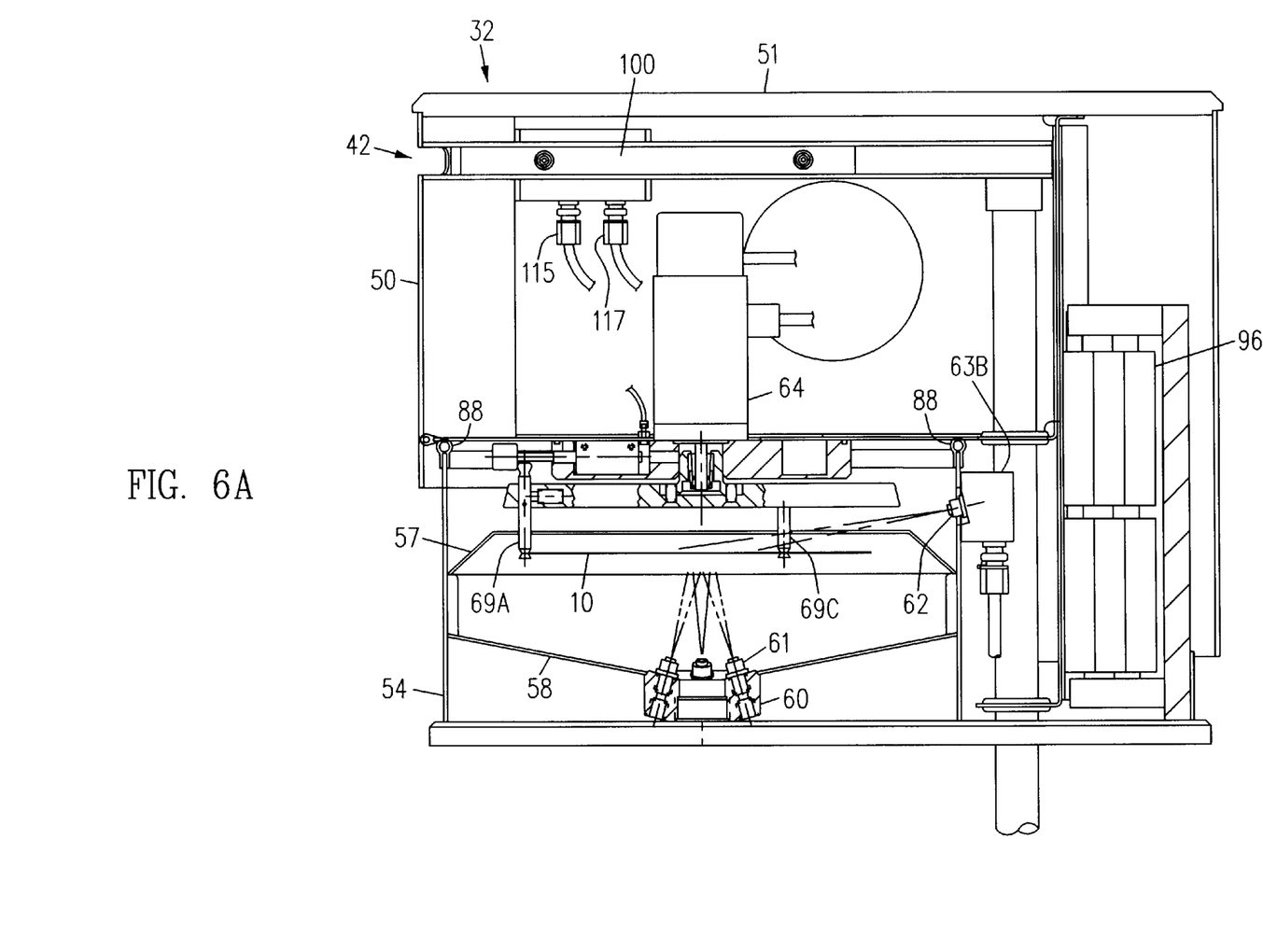
FIGS. 6A and 6B are broken away side and end views, respectively, of the wafer spin dryer in a closed position.
Figure 6B:
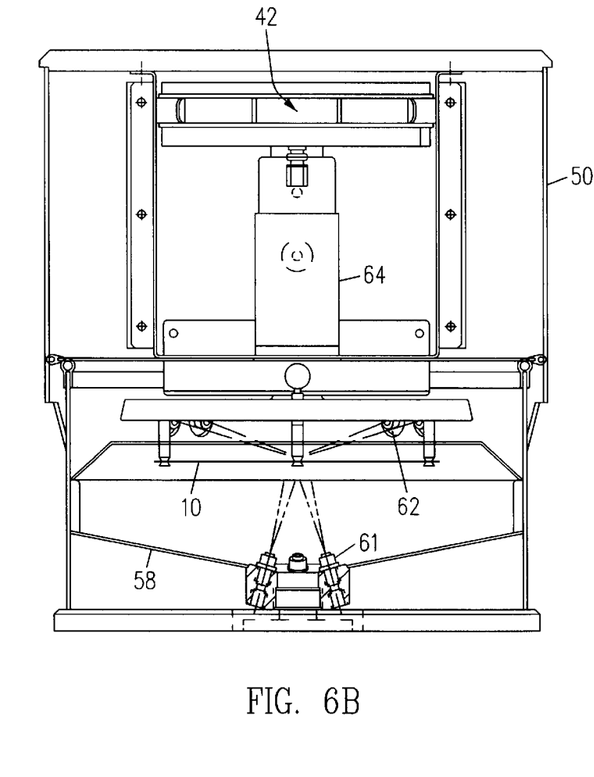

Lifting mechanism 93 is pneumatically actuated so as to lower hood unit 40, thereby closing off entrance 70. As shown in FIGS. 6A and 6B, a resilient ring or bead 88 is fixed to the top edge of side housing 54. When hood unit 40 is in its lowered position, bead 88 presses against the lower surface of mounting plate 52 to seal off drying chamber 55 from the outside environment.

Spin motor 64 is turned on to rotate platen 65 and wafer 10 at a relatively slow speed (e.g., 100 rpm) and rinse water (preferably deionized water) is sprayed through nozzles 62 onto the top (active) side of wafer 10. At the same time, rinse water is sprayed through nozzles 61 against the back side of wafer 10. This continues for approximately 10–15 seconds, at which time nozzles 61 and 62 are turned off and the rotational velocity of spin motor is increased to a much higher level (e.g., 5000 rpm). At this speed, centrifugal force causes the rinse water on the surfaces of wafer 10 to flow toward the edge of the wafer where it is thrown radially outward.

As shown in FIGS. 6A and 6B, when hood unit 40 is in its lowered position, wafer 10 is positioned well below the top edge of splash guard 57. Therefore, as rinse water is thrown from the edges of wafer 10, it strikes splash guard 10 and is deflected downward toward the portion of drying chamber 55 below wafer 10. None of this rinse water can splash back to the top surface of wafer 10, and thus the top (active) surface of wafer 10 is thoroughly and effectively dried. The rinse water runs down the sloping floor 58 and through drain 59.

The drying process normally lasts for about 45 seconds. Spin motor is then turned off, and lifting mechanism 93 is pneumatically actuated so as to raise hood unit 40, thereby opening entrance 70. Robot 38 inserts end-effector 38A (which by now has been cleaned) into drying chamber 55, and raises end-effector 38A until it is in contact with the lower surface of wafer 10. Pneumatic cylinder 76 is actuated to tilt finger 69A, releasing wafer 10 from fingers 69A, 69B and 69C, and robot 38 moves wafer 10 a short horizontal distance in the direction of finger 69A, insuring that the edge of wafer 10 is clear of notches 69D of fingers 69B and 69C. Robot 38 then lowers wafer 10, withdraws wafer 10 through entrance 70, and places wafer 10 in finished wafer cassette 39. This completes the wafer drying process.

Figure 10:
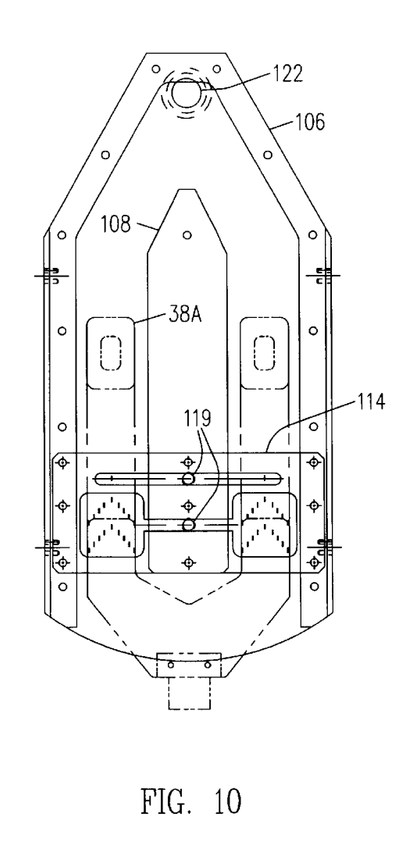
FIG. 10 is a top view of the end-effector cleaning section.
Figure 11:
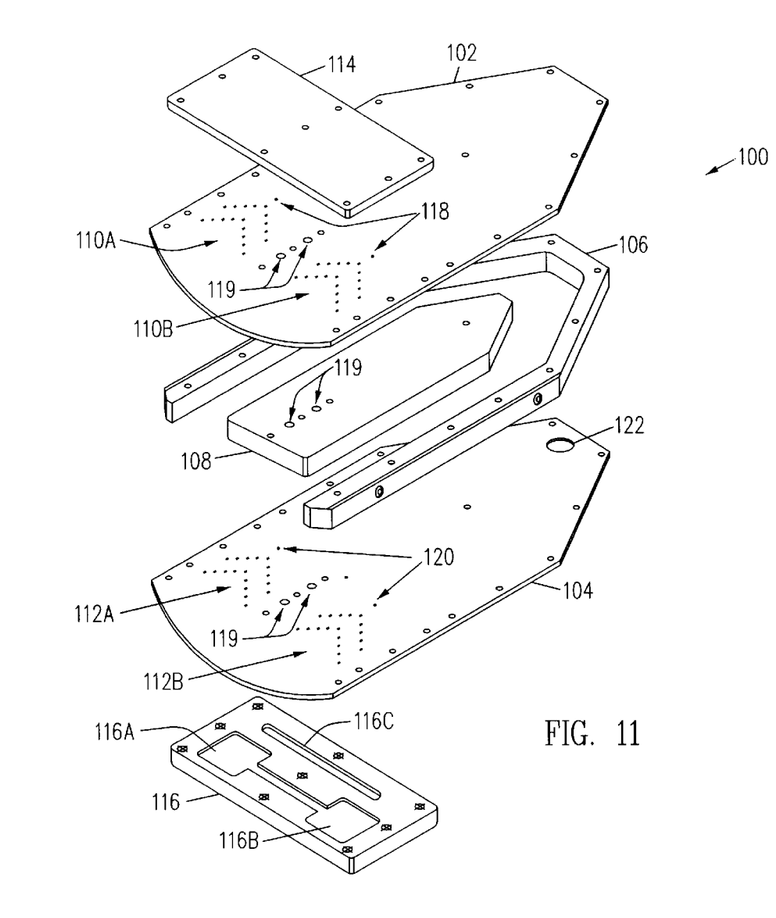
FIG. 11 is an exploded view of the end-effector cleaning section.

As described above, hood unit 40 also contains a end-effector cleaning section which is accessible through slot 42. End-effector cleaning section 100 is shown in FIGS. 5A and 6A. FIG. 10 is a top view of cleaning section 100, including end-effector 38A, and FIG. 11 is an exploded view of cleaning section 100. Included are a top plate 102 and a bottom plate 104, preferably made of stainless steel, and spacers 106 and 108, preferably made of plastic. Plates 102 and 104 and spacers 106 and 108 are fastened together with screws, creating an internal cavity which is shaped to fit end-effector 38A.

A series of holes 110A and 110B are drilled in top plate 102, and a corresponding series of holes 112A and 112B are drilled in bottom plate 104. Holes 110A, 110B, 112A and 112B are used to supply jets of heated nitrogen into the internal cavity of cleaning section 100, and they are preferably drilled at an angle of about 45° so that the flow of nitrogen is directed away from slot 42 and into the internal cavity of cleaning section 100. The nitrogen is directed into holes 110A and 110B through a top manifold 114 and into holes 112A and 112B though a bottom manifold 116. Manifolds 114 and 116 are clamped to top plate 102 and bottom plate 104, respectively, with screws (not shown). Using bottom manifold 116 as an example, a cavity 116A registers with holes 112A, and a cavity 116B registers with holes 112B. Nitrogen flows through a tube (not shown) and a fitting 115 (FIG. 6A) into cavities 116A and 116B and is ejected through holes 112A and 112B into the internal cavity of cleaning section 100. Top manifold 114 contains similar cavities with register with holes 110A and 110B and permit nitrogen to be ejected into the internal cavity of cleaning section 100 through holes 110A and 110B. Cavities 116A and 116B are connected with the corresponding cavities in top manifold 114 by means of a series of aligned holes that are formed in plates 102 and 104 and spacer 108. The nitrogen is heated to a temperature of 140° F. by a heater (not shown) which is located in wafer cleaning/drying system 30.

Top plate 102 also contains a pair of holes 118 which are used to spray water into the internal cavity of cleaning section 100, and bottom plate contains a similar pair of holes 120. Holes 118 are angled similarly to holes 110A and 110B, and holes 120 are angled similarly to holes 112A and 112B. Bottom manifold 116 contains a cavity 116C which registers with holes 120 and which is connected through holes in plates 102 and 104 and spacer 108 to a similar cavity in top manifold 114 which registers with holes 118. Water flows through a tube (not shown) and a fitting 117 (FIG. 6A) into cavity 116C.

When robot 38 has finished inserting wafer 10 into spin dryer 32, it inserts end-effector 38A through slot 42 into the internal cavity of cleaning section 100. Rinse water is sprayed through holes 118 and 120 against the top and bottom surfaces of end-effector 38A, removing grit and/or chemicals which have accumulated on the end-effector in the course of transferring the wafer from buffer unit 34 to cleaning unit 36 and to spin dryer 32. The rinse water exits cleaning section 100 through a drain 122. As the end-effector 38A is withdrawn from cleaning section 100, heated nitrogen is supplied through holes 110A, 110B, 112A and 112B. The jets of heated nitrogen "wipe" the rinse water from the surfaces of end-effector 38A and dry the end-effector before it is called upon to remove wafer 10 from spin dryer 32.

It is to be understood that the foregoing description is illustrative and not limiting. For example, while the embodiment described above is for drying a semiconductor wafer, the principles of this invention may be applied to drying other types of flat substrates. Many alternative embodiments in accordance with the broad principles of this invention will be apparent to persons skilled in the art.

We claim:

1. Apparatus for cleaning a robot end-effector, comprising a pair of flat, rigid plates held in a parallel, spaced-apart relationship by a rigid spacer extending between margins of said plates, said spacer defining sidewalls of a rigid, generally rectangular cavity between said plates for receiving said end-effector for cleaning, said sidewalls having an opening defining an entrance into said cavity through which said end-effector is inserted into, retracted from, and rigidly supported within said cavity by an arm of said robot in a position between and spaced apart from said plates, at least one of said plates having at least one opening therethrough defining a nozzle flush with said plate for directing a flow of fluid away from said entrance and against said end-effector.

2. The apparatus of claim 1, wherein said fluid comprises a gas or a liquid.

3. The apparatus of claim 1, wherein said at least one plate has at least two openings therethrough, each said opening defining a nozzle flush with said plate for directing a flow of a gas and a flow of a liquid, respectively, against said end-effector.

4. The apparatus of claim 3, wherein said at least one gas nozzle is nearer to said entrance of said cavity than said at least one liquid nozzle.

5. The apparatus of claim 3, wherein said at least two holes in said at least one plate each comprises a respective one of a first and a second set of holes, each said hole in each said set defining a nozzle flush with said plate for directing a flow of a gas and a flow of a liquid, respectively, against said end-effector.

6. The apparatus of claim 5, wherein at least one of said first and said second set of holes is arranged in V-shaped rows of said holes.

7. The apparatus of claim 5, further comprising a manifold on a surface of said at least one plate opposite to said cavity between said plates for providing said first set of said holes with said flow of said gas and said second set of said holes with said flow of said liquid.

8. The apparatus of claim 7, wherein said manifold comprises a pair of separate chambers, each said chamber being registered in fluid communication with a respective one of said first and said second sets of holes.

9. The apparatus of claim 1, wherein said at least one hole in said at least one plate is formed at an angle relative to said plate to direct said flow of fluid away from said entrance to said cavity.

10. The apparatus of claim 9, wherein said angle is about 45°.

11. The apparatus of claim 1, wherein said end-effector comprises a pair of bifurcated fingers, and further comprising an elongated member extending between said parallel plates and disposed between said fingers when said end-effector is resident in said cavity, said member having a conduit extending therethrough in fluid communication with a surface of each of said plates opposite to said cavity.

* * * * *